(12) United States Patent
Lander

(10) Patent No.: US 9,061,889 B2
(45) Date of Patent: Jun. 23, 2015

(54) MEMS MICROPHONE

(75) Inventor: Robert J. P. Lander, Leuven (BE)

(73) Assignee: NXP, B.V., Eindhoven (NL)

( * ) Notice: Subject to any disclaimer, the term of this patent is extended or adjusted under 35 U.S.C. 154(b) by 899 days.

(21) Appl. No.: 13/211,783

(22) Filed: Aug. 17, 2011

(65) Prior Publication Data

US 2012/0045078 A1  Feb. 23, 2012

(51) Int. Cl.
*H04R 19/04* (2006.01)
*B81B 7/00* (2006.01)

(52) U.S. Cl.
CPC ......... *B81B 7/0048* (2013.01); *Y10T 29/49005* (2013.01); *B81B 2201/0257* (2013.01)

(58) Field of Classification Search
CPC .............. H04R 19/005; H04R 19/04; H04R 2201/003; H01L 2924/10253; H01L 2924/1026; B81C 1/00; B81C 1/158; B81C 1/261; B81C 1/349; B81C 1/436; B81B 220/10257; B81B 7/48; B81B 7/45; B81B 7/35; B81B 7/51; B81B 2201/0257
USPC ......... 381/174, 175, 191, 113, 190, 181, 358, 381/360, 171, 333, 337, 352, 361, 176, 381/173; 29/25.41, 25.42; 367/174, 181
See application file for complete search history.

(56) References Cited

U.S. PATENT DOCUMENTS

| | | | |
|---|---|---|---|
| 5,452,268 A * | 9/1995 | Bernstein | 367/181 |
| 7,030,536 B2 * | 4/2006 | Smith et al. | 310/309 |
| 7,329,933 B2 * | 2/2008 | Zhe et al. | 257/419 |
| 7,402,449 B2 * | 7/2008 | Fukuda et al. | 438/53 |
| 8,921,957 B1 * | 12/2014 | Zhang et al. | 257/416 |
| 2005/0035446 A1 | 2/2005 | Karpman et al. | |
| 2007/0165896 A1 * | 7/2007 | Miles et al. | 381/356 |
| 2009/0041270 A1 * | 2/2009 | Schrank et al. | 381/174 |
| 2009/0169035 A1 * | 7/2009 | Rombach et al. | 381/175 |
| 2010/0002543 A1 * | 1/2010 | Schlosser et al. | 367/181 |

FOREIGN PATENT DOCUMENTS

| | | |
|---|---|---|
| CN | 1791281 A | 6/2006 |
| CN | 101022685 A | 8/2007 |

(Continued)

OTHER PUBLICATIONS

"ARDE: Aspect Ratio Dependent Etching", Oxford Instruments, retrieved from the Internet at: http://www.oxfordplasma.de/process/arde.htm, 1 pg. (Aug. 16, 2011).

(Continued)

*Primary Examiner* — Davetta W Goins
*Assistant Examiner* — Jasmine Pritchard

(57) ABSTRACT

A MEMS microphone has a support surface, a microphone substrate over the support surface and an assembly of a microphone membrane and spaced back electrode supported over the substrate. The substrate has an opening beneath the assembly. The interface between the support surface and the substrate comprises a plurality of discrete spaced portions. This structure provides some resilience to differential expansion and contraction that can arise during processing. The support surface can then be a different material to the substrate, for example a PCB laminate as the support surface and silicon as the substrate.

11 Claims, 4 Drawing Sheets

(56) References Cited

FOREIGN PATENT DOCUMENTS

| JP | 2002095093 A | 3/2002 |
| JP | 2005/323288 A | 11/2005 |
| JP | 2006-302943 A | 11/2006 |
| KR | 100737405 B1 | 7/2007 |
| WO | 2009/095856 A2 | 8/2009 |

OTHER PUBLICATIONS

Extended European Search Report for European Patent Appln. No. 10173323.6 (Feb. 21, 2011).
Office Action from Counterpart application CN 201110235672.7 (Sep. 22, 2013).

* cited by examiner

MEMS MICROPHONE

This application claims the priority under 35 U.S.C. §119 of European patent application no. 10173323.6, filed on Aug. 18, 2010, the contents of which are incorporated by reference herein.

FIELD OF THE INVENTION

This invention relates to MEMS microphones.

BACKGROUND OF THE INVENTION

Loudspeakers and microphones essentially comprise a movable diaphragm or other member which provides conversion between a sound pressure wave and an electrical signal.

Microphones are moving from typical analogue microphones to digital microphone modules. These microphone modules typically consist of a sensor manufactured in a micro-electro-mechanical system (MEMS) process and an analogue to digital converter (ADC). The output of the ADC (typically a sigma delta type converter) is a PDM (pulse density modulation) stream that outputs the data to a baseband processor.

MEMS microphones offer a cheaper and more reproducible alternative to traditional electret condenser microphones (ECM) for mass market applications such as GSM.

The membrane in a MEMS microphone is typically a silicon membrane, which is suspended over a base substrate. The base substrate is glued to a laminate, which carries other components, such as ICs for processing the microphone signals. The response of a MEMS microphone is greatly influenced by the stress in the Si membrane that moves with changes in sound pressure. This stress can be affected greatly by strain in the substrate induced by differences in thermal expansion coefficient, for example between the base substrate of the MEMS microphone structure and a laminate on which it is glued.

SUMMARY OF THE INVENTION

According to the invention, there is provided a microphone a MEMS microphone comprising:
  a support surface;
  a microphone substrate over the support surface;
  an assembly of a microphone membrane and spaced back electrode supported over the substrate, wherein the substrate has an opening beneath the assembly,
  wherein the substrate comprises a lower region which is patterned to define a plurality of discrete spaced portions or a plurality of discrete spaced openings at the interface between the support surface and the substrate, wherein the patterning extends only partially into the substrate.

By defining the interface as a set of discrete portions (i.e. portions that are not connected to each other in the plane of the interface), the structure provides some resilience to differential expansion and contraction that can arise during processing. The support surface can then be a different material to the substrate, for example a PCB laminate as the support surface and silicon as the substrate.

Because the patterning extends only partially into the substrate, one side of the substrate has the desired patterning to allow differential expansion and contraction, and the other side has a continuous support surface, for supporting the microphone assembly.

The discrete spaced portions can comprise an array of pillar ends of the substrate. By forming pillars at the surface of the substrate, a uniform support interface can be defined, which allows differential expansion and contraction in all directions. However, concentric rings can instead be used.

The assembly can comprise a microphone membrane over the substrate, a sacrificial spacing layer over the microphone membrane, and the back electrode supported over sacrificial spacing layer. This defines a structure with the membrane at the bottom, the back volume (so that sound pressure excites the membrane through the back electrode). However, the microphone can be encapsulated so that the back volume is above the membrane. In this case, the support surface can have a sound inlet opening.

The substrate can comprise the base layer of a SOI substrate arrangement, and the membrane comprises the top silicon layer of the SOI substrate. The back electrode preferably comprises a perforated layer, both to define etch openings and to provide air passageways.

The invention also provides a method of manufacturing a MEMS microphone, comprising:
  forming an assembly of a microphone membrane and spaced back electrode over a microphone substrate;
  forming an opening through the substrate beneath the assembly; and
  attaching the substrate and assembly to a support surface,
  wherein forming an opening also comprises patterning the microphone substrate other than where the opening is formed by etching only partially into a lower surface of the substrate,
  such that after the attaching to the support surface, the interface between the support surface and the substrate comprises a plurality of discrete spaced portions.

The patterning can define narrow channels, wherein the channel width is selected such that the etching conditions to define the opening result in the channels which extend partially through the substrate. In this way, the existing etch process required to form the opening in the substrate is used to define the patterning.

BRIEF DESCRIPTION OF THE DRAWINGS

An example of the invention will now be described in detail with reference to the accompanying drawings, in which.

DETAILED DESCRIPTION OF EMBODIMENTS

The invention provides a MEMS microphone in which a microphone structure is provided on a carrier, for example a circuit board laminate. The base of the microphone structure is a substrate, for example a silicon substrate. The bottom of the substrate, i.e. the side facing the carrier, is patterned to define a stress relief pattern at which there is connection to the underlying carrier. This improves the tolerance of the structure to different thermal expansion or contraction of the different layers during processing.

Figure 1:
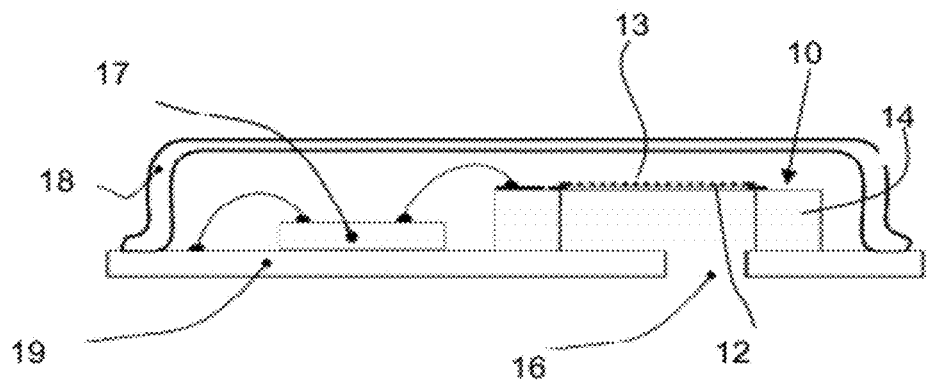
FIG. 1 shows a known MEMS capacitive microphone design.

FIG. 1 shows a known MEMS capacitive microphone design, which has a bottom sound-inlet port.

The microphone is formed as an integrated MEMS device 10, in which a membrane 12 is suspended over an opening in the semiconductor substrate 14. A back electrode 13 has perforations to allow the flow of air so that the membrane can move. The membrane is exposed to the sound pressure at the acoustic inlet 16.

In this design, an encapsulated volume over the microphone defines the back volume of the microphone. The microphone signals are processed by an ASIC 17, and the components of the microphone are sealed in the back volume defined by a cap 18 and the laminate 19 (i.e. a PCB) which carries the components.

This invention is not concerned with the encapsulation of the microphone, and indeed can be applied to microphone designs which are not encapsulated. Furthermore, the sound inlet can be above instead of beneath the microphone structure.

Figure 2:
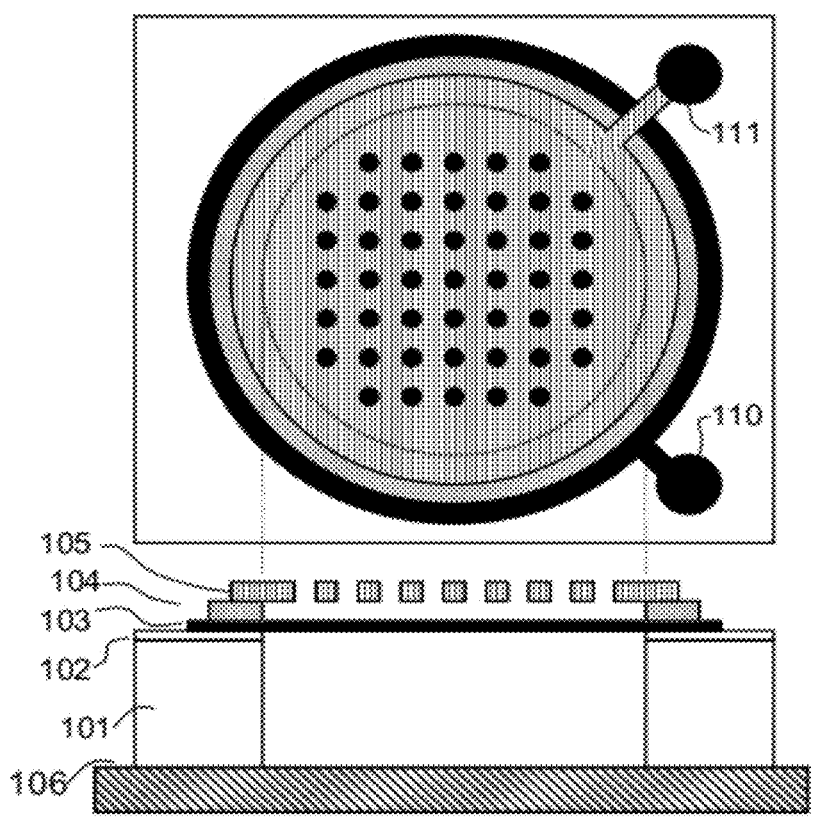
FIG. 2 shows another known MEMS capacitive microphone design in more detail.

FIG. 2 shows in more detail another example of standard MEMS microphone structure, but with the sound inlet above the microphone structure. In this case, the enclosed volume beneath the membrane defines the microphone back volume. The plan view of the microphone as well as the cross sectional view are shown.

FIG. 2 shows the base silicon substrate 101, a buried oxide 102, and the silicon membrane electrode 103. These three layers can form a standard SOI (silicon on insulator) substrate. A sacrificial spacer layer 104 is provided over the SOI substrate. The back electrode is shown as 105. This is patterned to define the back electrode openings, and these openings are used to etch the sacrificial layer. The microphone structure is mounted on a laminate 106.

The substrate 101 is back etched to define the opening in the substrate and insulator layer, beneath the membrane 103.

As shown in the plan view, an electrical contact 110 is made to the membrane 103, and an electrical contact 111 is made to the back electrode 105.

The structure is glued to the laminate 106 at elevated temperature. Strain is induced in the substrate 101, primarily during the cool-down phase due to differences in thermal expansion coefficient between the substrate 101 and the laminate 106. Strain in the substrate results in undesirable and poorly-controlled stress in the membrane 103.

The structure of FIG. 2 is well known, as well as the manufacturing method to produce the structure.

The invention provides a modification to the silicon substrate.

Figure 3:
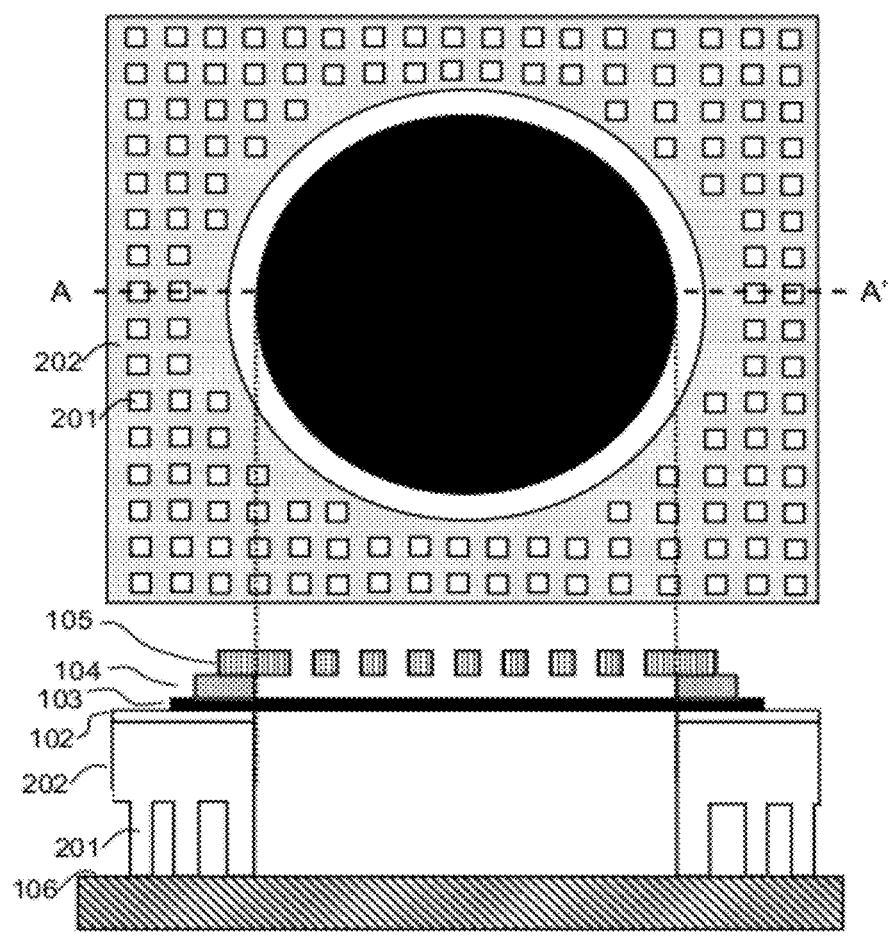
FIG. 3 shows an example of MEMS capacitive microphone design of the invention.

FIG. 3 shows a bottom view and cross section view of one realization of the MEMS microphone structure of the invention.

The membrane 103, spacer 104 and back electrode 105 are the same as in FIG. 2. The bottom substrate 202 of the SOI substrate has a patterned lower surface. This patterning provides channels which extend into the lower surface so that the bottom surface, which contacts the underlying support laminate, is not a complete continuous area. Instead, it makes contact with the support laminate at a plurality of discrete areas 201. The substrate has a non-patterned region 202 which supports the insulator 102 and membrane 103 and the overlying sacrificial spacer layer 104 and back electrode 105.

The substrate 202 can be of Si, Ge, SiGe, SiC, $SiO_2$ or $Si_3N_4$. The layer 102 is optional for the case of non-conducting substrates (e.g. SiO2 of Si3N4), and can compromise $SiO_2$ or $Si_3N_4$. The membrane 103 can be of Si, Ge, SiGe, SiC, or metals such as Al, W, Ti, or electrically conducting nitrides of these metals. The layer 104 can comprise $SiO_2$ or $Si_3N_4$. The layer 105 can similarly be of Si, Ge, SiGe, SiC, or metals such as Al, W, Ti, or electrically conducting nitrides of these metals. Other materials known in the art could be used, as will be apparent to skilled persons.

Also, the laminate 106 can be of a material known in the art. In this embodiment, a glass fabric reinforced epoxy Bismaleimide Triazine cured resin laminate is used. Standard laminate substrates, including standard solder mask material and metalisation, e.g. Au, Ni, Cu, can be used instead, as well as ceramic substrates such as HTCC and LTCC.

The substrate is partially etched to allow elastic relaxation of any lateral strain induced at the substrate-laminate interface whilst the upper, non-patterned, part of the substrate provides a rigid support and sustains the desired stress levels (determined by wafer-level process) in the electrode structure.

Figure 5:
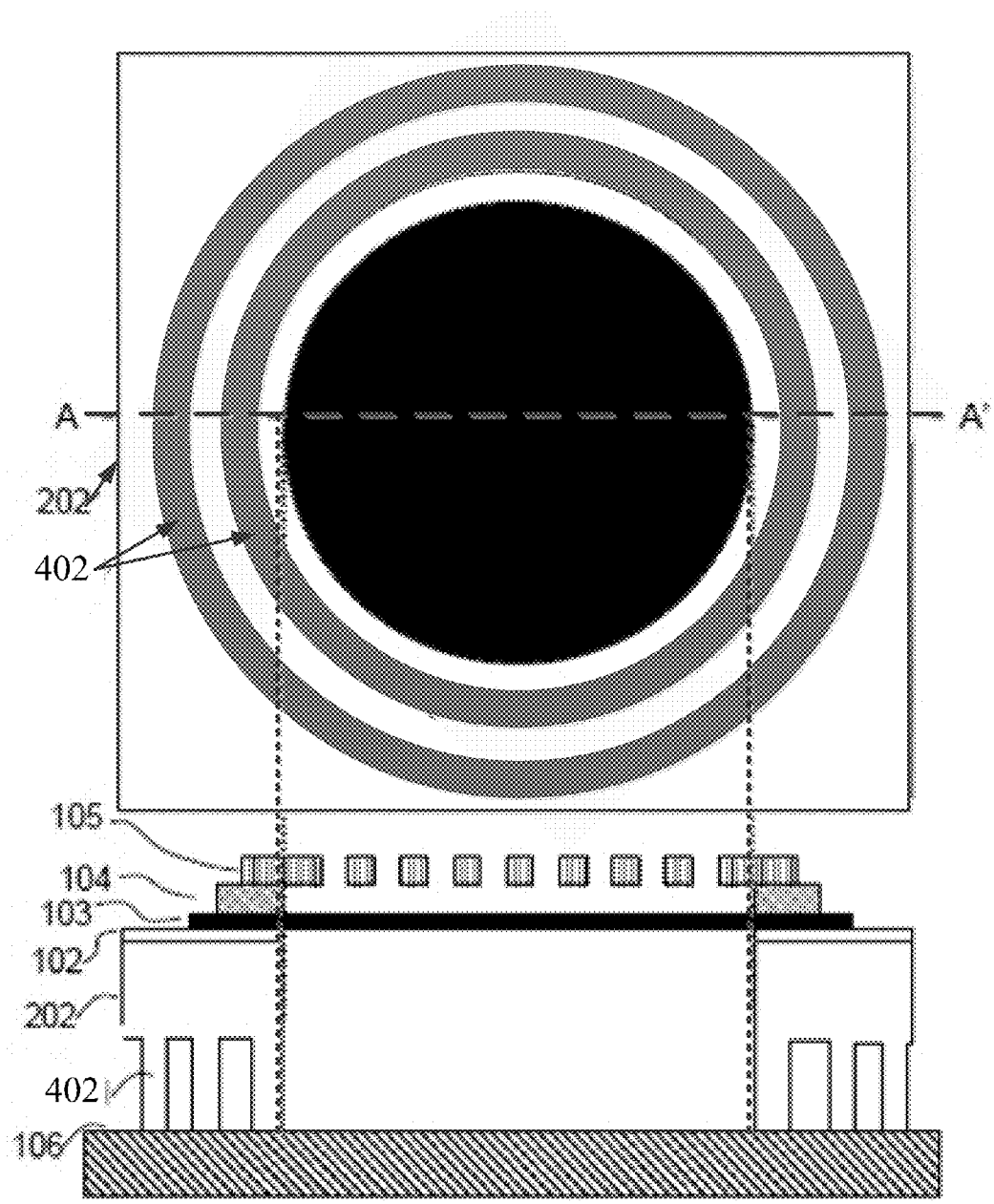
FIG. 5 shows a second example embodiment of a MEMS capacitive microphone design.

The contact between the laminate 106 and the substrate 201 has a set of discrete contact areas. In the example shown, the substrate is patterned to define an array of pillars. The structure allows lateral relative movement. Alternative lateral structures such as concentric circles 402 in FIG. 5 or vanes are possible, and various etch depths can be chosen without additional complexity such that the strain relief can be optimized with respect to structural integrity.

Figure 4:
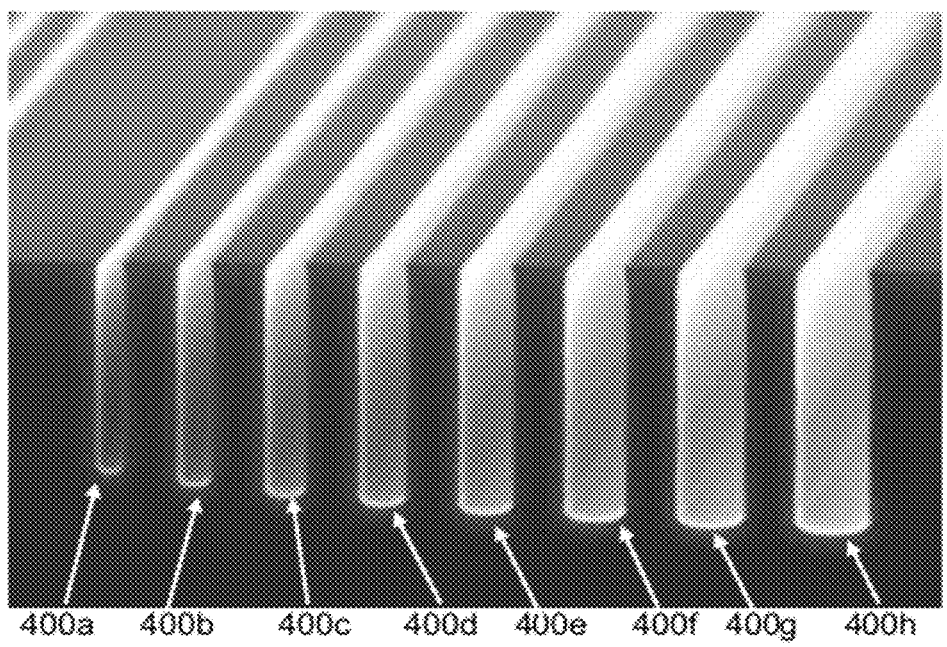
FIG. 4 is used to show how the pattern design enables the existing substrate etch to be used to form the pattern in the substrate in accordance with an example of the invention.

This partial etch can be achieved with no modifications to the standard Si MEMS microphone process. In particular, the etching can take place and at the same time as the full etch of the back-volume of the microphone by taking advantage of the aspect-ratio dependent etch rate of silicon. This effect is illustrated in FIG. 4.

The channels 400a to 400f are etched by the same etch process, but have progressively increasing width. The width increases progressively from 5 um to 14 um. As shown, the depth increases with increasing channel width.

If the spacing between the pillar regions 201 is sufficiently small compared to the depth of the pillars then the etch rate will drop dramatically. Thus, the depth of the patterned region 201 can be tuned by tuning the spacing of the pillars. In this way, the spacing between the pillars can be etched using the same etch process and for the same time as the etching of the back volume.

The etching process is typically a deep reactive ion etching (DRIE) process to anisotropically etch the MEMS substrate. Anisotropic etching avoids undercuts which would make the columns/pillars fragile.

By way of example, to ensure that the channels are only partially etched, yet provide the desired thermal tolerance, the contact area may be between 10% and 50% of the combined channel and contact area of the general contact area (by general contact area is meant the area excluding any large openings such as the substrate opening beneath the membrane). The lower 10% threshold is required so that the etching does not extend fully through the substrate. The larger 50% is required so that the gaps are significant enough to provide the desired movement freedom at the interface.

The range may be 10% to 35%. In the example of FIG. 3, the contact area is around 25%, having a regular array of square pillars spaced by the pillar width.

The pattern can for example extend to a depth of between 20% and 80% of the depth of the substrate. By way of example, the thickness of the base layer of an SOI substrate arrangement is typically in the range 200/700μ. In order to provide a suitable aspect ratio (channel width to depth) for the anisotropic etching to slow to prevent full etching of the channels even though the opening is fully etched by the same process, the maximum width of the channel is typically less than 200μ. Thus, the ratio of maximum channel width etched into the bottom surface of the substrate and the substrate thickness is in the range 0.3-1μ. By providing narrow etching channels in the substrate, a large number of separate contact areas can be provided at the interface The pattern does not need to be regular as in FIG. 3.

In the example above, the membrane is defined from the top layer of the SOI substrate, with the back electrode suspended above. However, the back electrode may instead be formed at the top of the SOI substrate arrangement, with the membrane suspended over the top, for example formed from polysilicon.

The use of a SOI substrate arrangement is not essential. For example, the microphone structure can be formed from other thin film layers deposited over a conventional semiconductor substrate. Thus, the membrane may not be silicon as in the example above.

The preferred example shown has a set of discrete contact areas at the substrate/carrier interface. However, a set of openings may be provided instead (for example the inverse of the structure shown in FIG. 3). Thus, the openings may be discrete separate islands instead of the substrate portions, and the remaining material can then define an interconnected grid, for example a square grid or a honeycomb grid.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A MEMS microphone comprising:
    a support surface;
    a substrate, having a cross-section, over the support surface;
    an assembly of a microphone membrane and spaced back electrode supported over the substrate, wherein the substrate has an opening beneath the assembly,
    wherein the substrate cross-section comprises a lower region which is patterned to define a plurality of discrete spaced portions at an interface between the support surface and the substrate,
    wherein the substrate cross-section further comprises an upper region which is non-patterned at an interface between the support surface and the assembly, and
    wherein the patterning extends through the lower region of the substrate cross-section, but not through the upper region of the substrate cross-section.

2. A microphone as claimed in claim 1, wherein the discrete spaced portions comprise an array of pillar ends of the substrate.

3. A microphone as claimed in claim 1, wherein the discrete spaced portions comprise an array of concentric rings.

4. A microphone as claimed in claim 1, wherein the assembly comprises a microphone membrane over the substrate, a sacrificial spacing layer over the microphone membrane, and the back electrode supported over sacrificial spacing layer.

5. A microphone as claimed in claim 4, further comprising an insulator layer between the substrate and the microphone membrane.

6. A microphone as claimed in claim 1, wherein the substrate comprises the base layer of a SOI substrate arrangement, and the membrane comprises the top silicon layer of the SOI substrate.

7. A microphone as claimed in claim 1, wherein the back electrode comprises a perforated layer.

8. A method of manufacturing a MEMS microphone, comprising:
    forming an assembly of a microphone membrane and spaced back electrode over a microphone substrate; the substrate having a cross-section,
    forming an opening through the substrate beneath the assembly; and
    attaching the substrate and assembly to a support surface,
    wherein forming an opening also comprises patterning the microphone substrate cross-section other than where the opening is formed by etching only partially into a lower surface of the substrate cross-section, such that after the attaching to the support surface, an interface between the support surface and the substrate cross-section comprises a plurality of discrete spaced portions forming an upper region of the substrate cross-section, wherein the upper region which is non-patterned at an interface between the support surface and the assembly, and wherein the patterning extends through the lower region of the substrate cross-section, but not through the upper region of the substrate cross-section.

9. A method as claimed in claim 8, wherein the patterning defines an array of one of pillar ends and concentric rings.

10. A method as claimed in claim 8, wherein the forming an assembly of a microphone membrane and spaced back electrode over a microphone substrate comprises processing a SOI substrate arrangement, wherein the substrate comprises the base layer of the SOI substrate arrangement, and the membrane comprises the top silicon layer of the SOI substrate.

11. A method as claimed in claim 8, wherein the patterning defines a plurality of narrow channels, wherein a channel width is selected such that the etching conditions to define the opening results in the channels which extend partially through the substrate.

* * * * *